United States Patent
Cheng et al.

(10) Patent No.: US 9,892,922 B1
(45) Date of Patent: Feb. 13, 2018

(54) METHODS FOR FABRICATING INTEGRATED CIRCUITS WITH TRIPLE GATE OXIDE DEVICES

(71) Applicant: Altera Corporation, San Jose, CA (US)

(72) Inventors: Ning Cheng, San Jose, CA (US); Peter Smeys, San Jose, CA (US)

(73) Assignee: Altera Corporation, San Jose, CA (US)

( * ) Notice: Subject to any disclaimer, the term of this patent is extended or adjusted under 35 U.S.C. 154(b) by 686 days.

(21) Appl. No.: 13/936,066

(22) Filed: Jul. 5, 2013

(51) Int. Cl.
*H01L 21/3205* (2006.01)
*H01L 21/4763* (2006.01)
*H01L 21/28* (2006.01)
*H01L 27/092* (2006.01)

(52) U.S. Cl.
CPC ...... *H01L 21/28008* (2013.01); *H01L 27/092* (2013.01)

(58) Field of Classification Search
CPC ......... H01L 21/28114; H01L 29/42376; H01L 29/785; H01L 29/66795; H01L 29/66545; H01L 21/28273; H01L 21/28282; H01L 29/42328; H01L 29/42332; H01L 29/7923; H01L 29/42348; H01L 29/7887; H01L 29/42344; H01L 29/7851
See application file for complete search history.

(56) References Cited

U.S. PATENT DOCUMENTS

| | | | |
|---|---|---|---|
| 8,294,212 B2 | 10/2012 | Wang et al. | |
| 8,378,414 B2 | 2/2013 | Miller et al. | |
| 2006/0121678 A1* | 6/2006 | Brask et al. | 438/287 |
| 2009/0206406 A1* | 8/2009 | Rachmady et al. | 257/365 |
| 2012/0001197 A1* | 1/2012 | Liaw | H01L 27/11 257/77 |
| 2012/0091528 A1* | 4/2012 | Chang et al. | 257/347 |
| 2013/0009231 A1* | 1/2013 | Xia | H01L 27/11534 257/316 |
| 2013/0043536 A1 | 2/2013 | Rahim et al. | |
| 2013/0264652 A1* | 10/2013 | Zhu | H01L 21/28088 257/369 |

(Continued)

FOREIGN PATENT DOCUMENTS

EP 1503424 2/2005

OTHER PUBLICATIONS

Smeys et al., U.S. Appl. No. 13/304,713, filed Nov. 28, 2011.

*Primary Examiner* — Charles Garber
*Assistant Examiner* — Abdulfattah Mustapha
(74) *Attorney, Agent, or Firm* — Jason Tsai

(57) ABSTRACT

A method of fabricating an integrated circuit includes forming a plurality of polysilicon gate electrode structures over a plurality of fin-shaped channel structures. A portion of the plurality of polysilicon gate electrode structures may then be removed to expose a surface region of a fin-shaped channel structure in the plurality of fin-shaped channel structures. The remaining portion of the polysilicon gate electrode structures may form a plurality of polysilicon transistors. A layer of high-k dielectric material is deposited on the exposed surface region of the fin-shaped channel structure. A metal layer may be deposited over the high-k dielectric material to form at least one high-k metal gate transistor over the fin-shaped channel structure.

22 Claims, 9 Drawing Sheets

(56) References Cited

U.S. PATENT DOCUMENTS

2014/0213031 A1* 7/2014 Lin ................... H01L 29/66545
                                                                438/296
2015/0102416 A1* 4/2015 Yin ................... H01L 21/82384
                                                                257/369

* cited by examiner

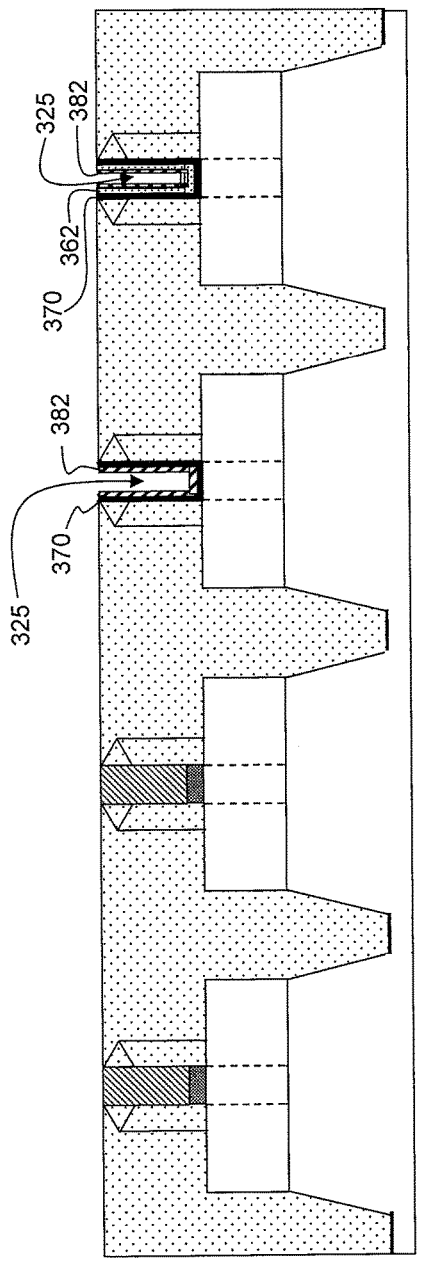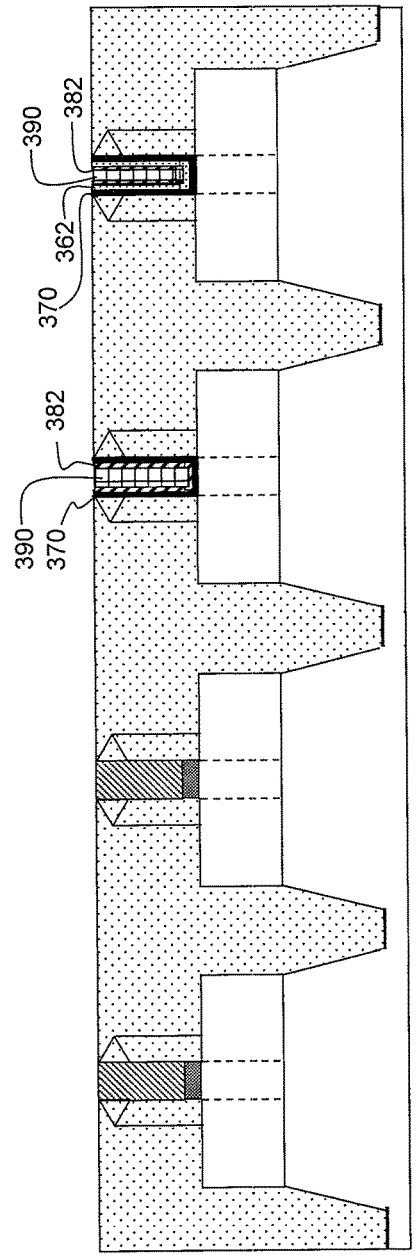
FIG. 3E
FIG. 3F

METHODS FOR FABRICATING INTEGRATED CIRCUITS WITH TRIPLE GATE OXIDE DEVICES

BACKGROUND

As demand for high performance devices grows, an increasing number of transistors are packed into a single integrated circuit chip. To fit increasingly more transistors on a single chip, the size of the transistors has been continuously reduced. In a planar polysilicon transistor, as the size of the transistor shrinks, the distance between the source and drain is reduced and it becomes increasingly difficult for the gate to control the flow of current through the transistor.

Fin field-effect transistors (FinFETs) have been developed in an attempt to solve this problem by wrapping the gate around a silicon "fin" structure. Compared to conventional planar transistors, this structure allows the gate to have a better control over the flow of current. Generally, to form a gate structure in a transistor (i.e., a planar transistor or a FinFET), a polysilicon layer or metal layer is disposed over a dielectric layer such as silicon oxide.

Metal gates are often used with high-k dielectric layers to form transistors known as high-k metal gate (HKMG) transistors. Compared to polysilicon gate oxide transistors, HKMG transistors may exhibit lower current leakage. However, even though HKMG transistors may reduce overall current leakage in an integrated circuit device, they generally offer fewer levels of gate oxide thicknesses compared to polysilicon transistors (e.g., transistors with polysilicon gate structures).

Generally, HKMG transistors may offer only two gate oxide thicknesses to support two different voltage levels (e.g., low voltage high performance gate oxide and high voltage gate oxide). However, circuitry within an integrated circuit device may require more than two different operating voltages. As an example, different circuit elements in the integrated circuit device may operate either at a low, medium, or high voltage level.

As the thickness of the oxide layer is varied to accommodate devices operating at different voltages, an integrated circuit device with triple gate oxide (TGO) devices, or transistors with three levels of oxide thicknesses, may thus allow better voltage control.

SUMMARY

An integrated circuit with triple gate oxide devices and techniques for fabricating such an integrated circuit are provided. Embodiments of the present invention include fabrication techniques for producing FinFET integrated circuits with triple gate oxide transistors.

It is appreciated that the present invention can be implemented in numerous ways, such as a process, an apparatus, a system, or a device. Several inventive embodiments of the present invention are described below.

A method of fabricating an integrated circuit includes forming multiple polysilicon gate structures over multiple respective fin-shaped channel structures. As a result, multiple polysilicon transistors may be formed. Some of the plurality of polysilicon gate structures may be removed to expose a surface region of one of the fin-shaped channel structures. A layer of high-k dielectric material is deposited on the exposed surface region of that fin-shaped channel structure. In one embodiment, a metal layer may then be deposited over the high-k dielectric material to form a high-k metal gate transistor over that particular fin-shaped channel structure. In one embodiment, the fabricated integrated circuit may include a plurality of polysilicon transistors and high-k metal gate transistors.

A method of fabricating an integrated circuit includes forming fin channel structures on a semiconductor substrate. Polysilicon gate electrodes may then be formed over a portion of the fin channel structures to form multiple polysilicon transistors. Metal gate electrodes are then formed over another portion of the fin channel structures to form multiple metal gate transistors. In one embodiment, a high-k dielectric material may be deposited over the second portion of the fin channel structures prior to the formation of the metal gate electrodes.

An integrated circuit may include a substrate with fin channel structures. Polysilicon transistors are formed over a first portion of the fin channel structures. Metal gate transistors may be formed over a second portion of the fin channel structures. In one embodiment, the polysilicon transistors and the metal gate transistors are triple gate oxide devices formed in the integrated circuit device.

BRIEF DESCRIPTION OF THE DRAWINGS

FIGS. 3A-3F are cross-sectional views illustrating steps in fabricating a hybrid integrated circuit device with a plurality of polysilicon and metal gate transistors in accordance with one embodiment of the present invention.

DETAILED DESCRIPTION

The embodiments provided herein include integrated circuit devices with fin field-effect transistors (FinFETs) with triple gate oxide and methods for fabricating such devices.

It will be obvious to one skilled in the art that the present exemplary embodiments may be practiced without some or all of these specific details. In other instances, well-known operations have not been described in detail in order not to unnecessarily obscure the present embodiments.

Figure 1:
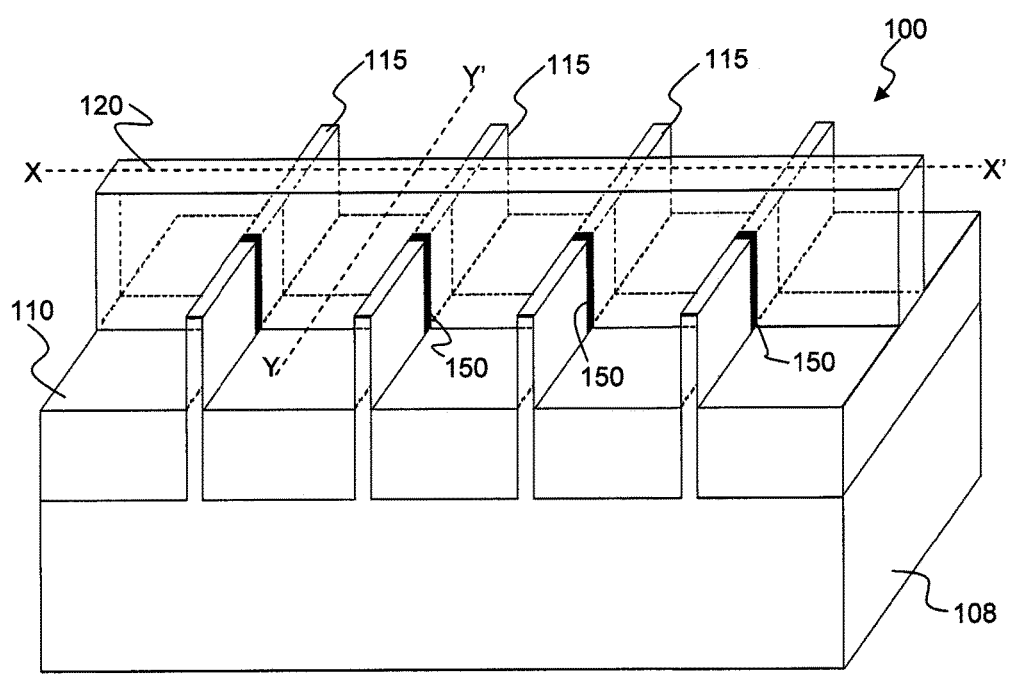
FIG. 1 shows a perspective view of an illustrative FinFET integrated circuit device in accordance with one embodiment of the present invention.

FIG. 1 shows a perspective view of a FinFET integrated circuit device 100 in accordance with one embodiment of the present invention. As with a conventional planar transistor device, a FinFET device includes a gate structure 120 formed over oxide layer 110 and silicon substrate 108. However, instead of placing the gate structure over a planar inversion layer (i.e., the layer where current flows from the source region to the drain region), a gate electrode structure in a FinFET device wraps around a three-sided silicon fin to create an inversion layer with a greater surface area compared to a typical planar device.

In the embodiment of FIG. 1, gate electrode structure 120 runs in the direction of line XX' whereas fins 115 run in the direction of line YY' that is perpendicular to line XX'. Multiple fins 115 may be connected together by gate electrode structure 120 for greater drive strength. Oxide layer 110 may isolate the plurality of fins 115 from each other while gate oxide layer 150 isolates gate electrode structure 120 from fins 115. Generally, gate electrode structure 120 may be a polysilicon gate structure or a metal gate structure. In one embodiment, a hybrid integrated circuit device may include transistors with polysilicon gate structures and metal gate structures.

Figure 2A:
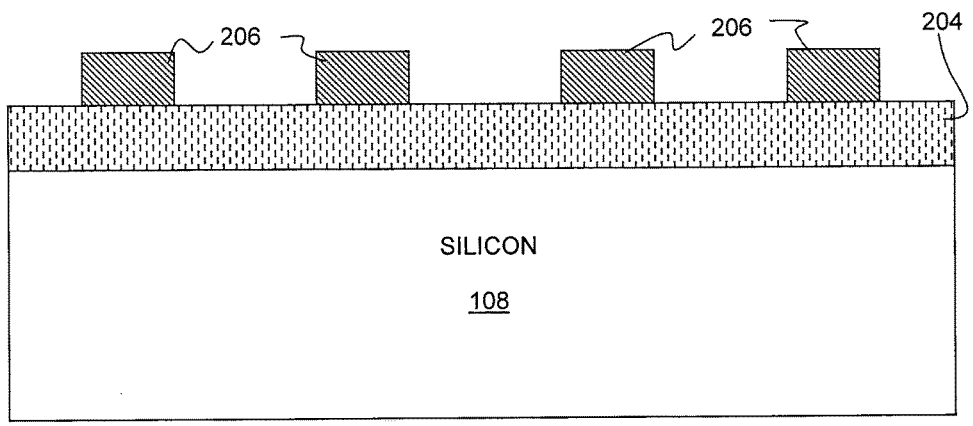
FIGS. 2A-2E show cross-sectional views illustrating steps in fabricating a FinFET device in accordance with one embodiment of the present invention.

FIGS. 2A-2E show cross-sectional views illustrating steps in fabricating a FinFET device in accordance with one embodiment of the present invention. It should be appreciated that FIGS. 2A-2E show cross sections of fins 115, or cross sections along the line XX', in FIG. 1. Referring to FIG. 2A, hard mask 204 is disposed over substrate 108. As an example, substrate 108 may be a p-doped silicon (Si) substrate and hard mask 204 may be a silicon nitride ($Si_3N_4$) mask. Photoresist 206 may be applied on top of hard mask 204 to define a pattern for the fin formation (at a later stage). Substrate 108 may be etched to form multiple fins.

Figure 2B:
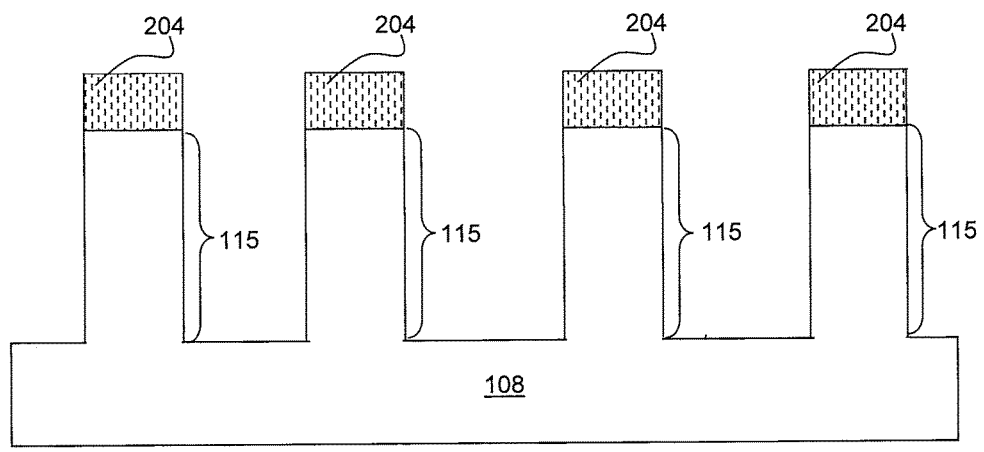
Figure 2C:
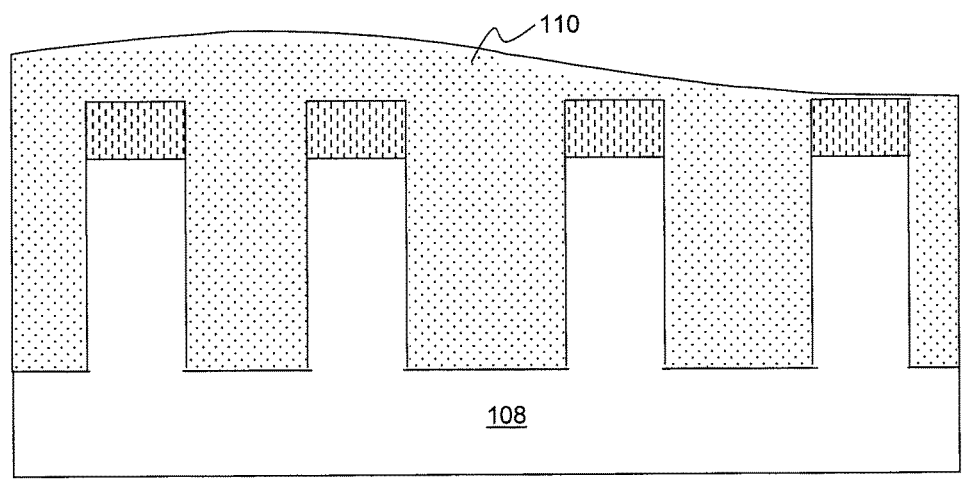

FIG. 2B shows a cross-sectional view of substrate 108 after fin etching. Generally, a dry or wet chemical etching process may be used to form fins 115 on substrate 108. Photoresist 206 shown in FIG. 2A is removed after the patterning or after the plurality of fins 115 has been formed. The remaining hard mask 204 may be left on top of fins 115 to act as a stop layer for a CMP process at a later stage. Oxide (not shown in FIG. 2B) may be disposed over substrate 108 to separate fins 115 from each other. FIG. 2C shows a cross-sectional view of the substrate 108 after oxide deposition. Oxide 110 may then be planarized by a chemical mechanical polishing (CMP) process.

Figure 2D:
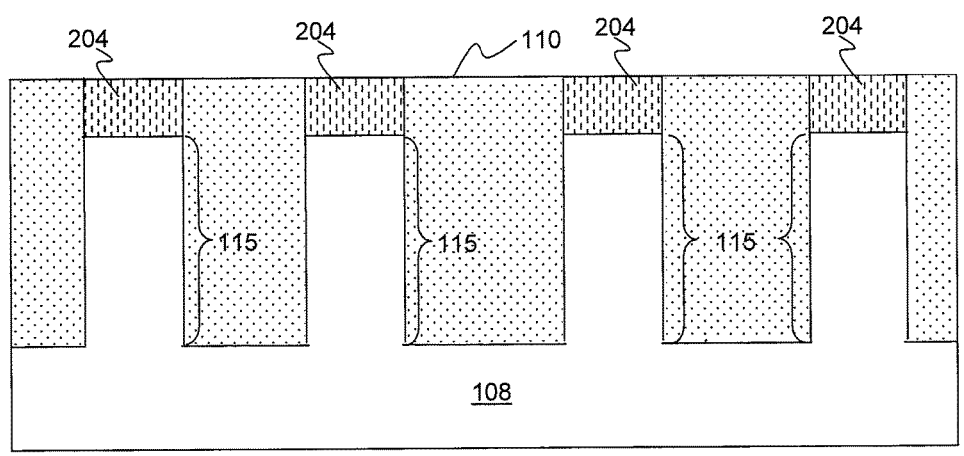

FIG. 2D shows a cross-sectional view of fins with oxide 110 separating them after the CMP process. As mentioned before, hard mask 204 may act as a stop layer for the CMP process such that oxide 110 is substantially level with the top surface of hard mask 204. After the planarization or CMP process, a portion of oxide 110 may be etched off to reveal the plurality of fins 115.

Figure 2E:
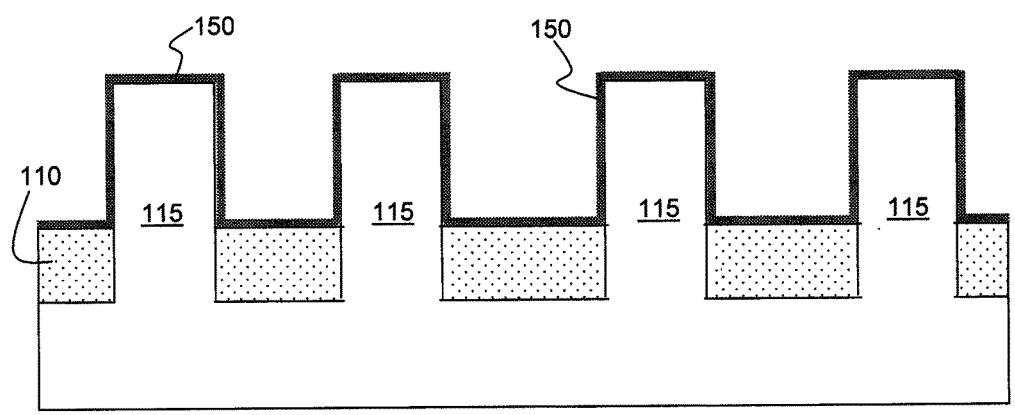

FIG. 2E is a cross-sectional view that illustrates fins 115 with oxide 110 separating them after a recess etch process. Hard mask 204 shown in FIGS. 2A-2D may be removed at this stage. A layer of gate oxide 150 may be deposited over fins 115 to isolate the fin channel structures from the gate electrode (not shown in FIG. 2E). The gate electrode, as shown by gate electrode structure 120 of FIG. 1, may be deposited on top of the fins 115 after the layer of gate oxide 150 has been deposited. As mentioned above, the gate electrode may be a polysilicon gate electrode or a metal gate electrode. In one embodiment, in a hybrid integrated circuit device with both polysilicon gate transistors and metal gate transistors, a polysilicon gate electrode may be deposited first before a metal gate electrode is deposited.

Figure 3A:
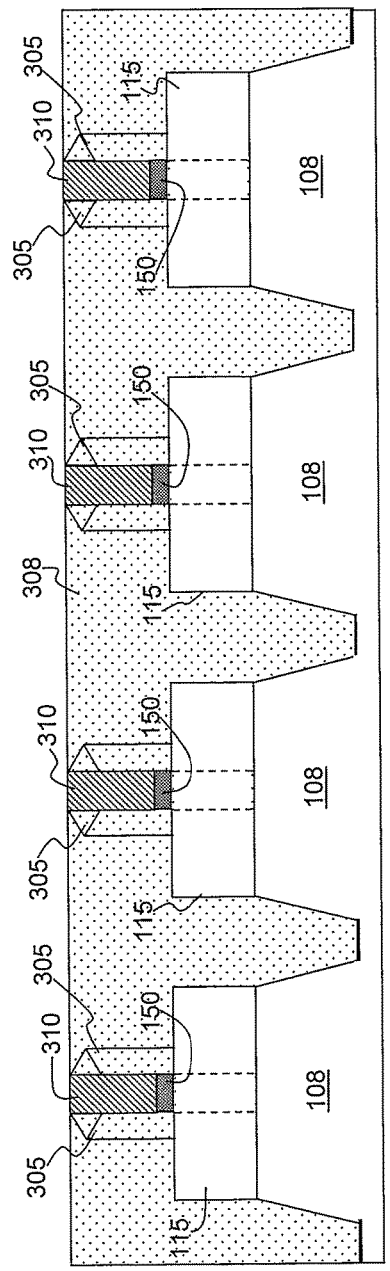

FIGS. 3A-3F are cross-sectional views illustrating steps in fabricating a hybrid integrated circuit device with a plurality of polysilicon and metal gate transistors in accordance with one embodiment of the present invention. It should be appreciated that FIGS. 3A-3F show cross sections of the gate structure 120 of FIG. 1 (i.e., cross sections along the line YY' in FIG. 1). It should be noted that even though only one gate structure 120 is shown over fins 115 along line YY' in FIG. 1, there may be more gate structures forming multiple transistor devices over fins 115. As shown in FIG. 3A, multiple polysilicon gate electrode structures 310 may be formed over the respective fins 115. It should be noted that, for the sake of brevity, conventional steps that are performed in order to form gate electrode structures 310 are not shown in FIG. 3A.

Generally, to form gate electrode structures 310, an oxide layer is grown over the fins 115 and silicon substrate 108. A polysilicon layer is then formed over the oxide layer. A portion of the polysilicon layer and oxide layer is removed to form polysilicon gate structures 310 with oxide layer 150. It should be noted that FIG. 3A shows a cross section of the gate structure after spacer formation, source and drain formation, inner layer dielectric (ILD) deposition, and CMP process. Source and drain regions (not shown) may be formed by ion implantation after spacers 305 are formed.

After source and drain formation, an inner layer dielectric (ILD) material 308 may then be deposited over fins 115, silicon substrate 108, and polysilicon gate structures 310. In one embodiment, ILD 308 may be similar to oxide 110 shown in FIGS. 2A-2E. The ILD 308 is then planarized by a CMP process. These steps are not shown and described in detailed herein in order to not obscure the present invention. The plurality of polysilicon gate structures 310 wrapping around the respedtive fins 115 in the embodiment of FIG. 3A may form a plurality of transistors with polysilicon gate electrode structures 310. The dotted lines in FIG. 3A represent sections of fins 115 that are wrapped around with polysilicon gate structures 310.

Figure 3B:
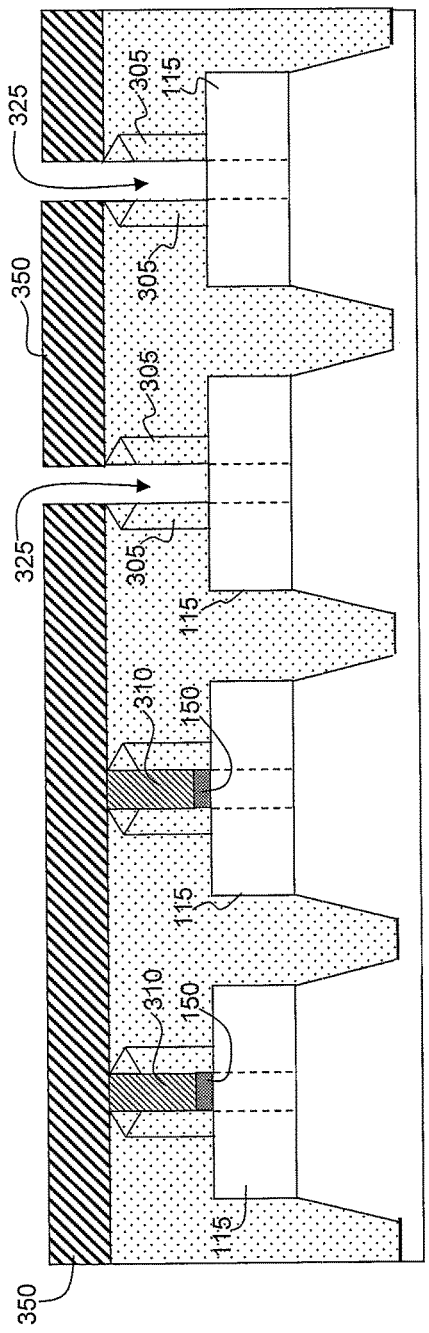

Next, with reference to FIG. 3B, an etch resistant material 350 may be patterned over a portion of the polysilicon gate electrode structures 310. As an example, etch resistant material 350 may be a hard mask and the exposed portion of the polysilicon gate electrode structures 310 (i.e., the portion that is unshielded by etch resistant material 350) is removed by an etch process. The exposed or unshielded portion of the polysilicon gate electrode structures 310, together with oxide layer 150, is removed, exposing the inner surface of spacers 305 and a surface region on each of the respective fins 115. This forms trench regions 325.

Figure 3C:
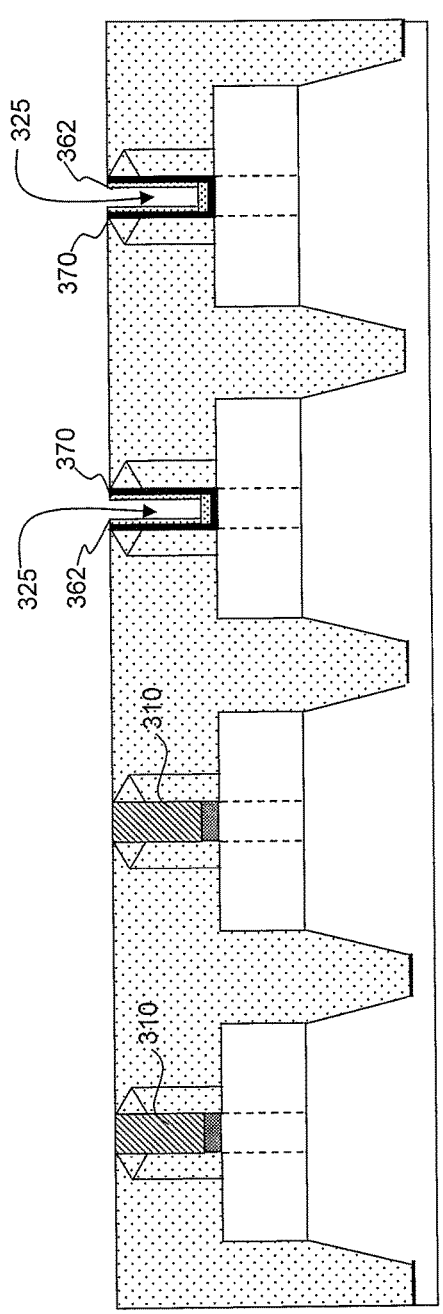

Next, with reference to FIG. 3C, trench regions 325 that are formed by the removal of the polysilicon gate structures 310 are lined with high-k dielectric material 370. High-k dielectric refers to a material with a relative dielectric constant ($\kappa$) that is higher than that of silicon dioxide. Some examples of high-k materials may include, among others, hafnium silicate, zirconium silicate, and hafnium dioxide. As shown in FIG. 3C, a PMOS work function metal layer 362 may be deposited over the conformal high-k dielectric material 370 in each of the trench regions 325.

Figure 3D:
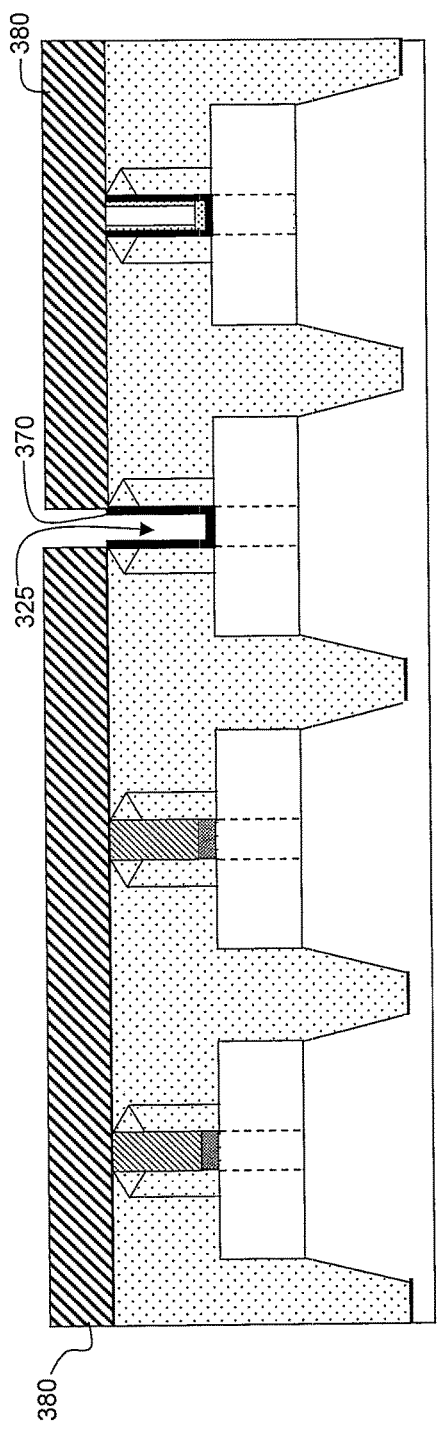

Next, with reference to FIG. 3D, another etch resistant material 380 may be patterned over the remaining polysilicon transistors and a portion of the trench regions 325 that have been lined with high-k dielectric material 370 and PMOS work function metal layer 362. PMOS work function metal layer 362 (shown in FIG. 3C) is etched off from the exposed portion of trench region 325 that has been lined with high-k dielectric material 370. The exposed portion where the PMOS work function metal layer is etched off from may be an NMOS region. Etch resistant material 380 may be removed after the PMOS work function metal layer has been etched off from the NMOS region.

Next, with reference to FIG. 3E, NMOS work function metal layer 382 is deposited over the conformal high-k dielectric material 370 in the trench regions 325. In one embodiment, as can be seen from FIG. 3E, the trench in the PMOS region may consist of three different layers, namely, high-k dielectric material 370, PMOS work function metal layer 362, and NMOS work function metal layer 382. It should be noted that the NMOS work function metal layer in the PMOS region may or may not be removed as it will not affect the functionality of the PMOS transistor (as long as the PMOS work function layer 362 is sufficiently thick).

Next, with reference to FIG. 3F, trench regions 325 in FIG. 3E are filled with metal 390 to form metal gate electrode structures. As an example, metal 390 may be bulk aluminum. It should be noted that conventional steps such as performing CMP on the metal layer and forming contact modules are not shown in order to not obscure the present invention. The resulting integrated circuit device as shown in FIG. 3F may be a hybrid device that consists of multiple polysilicon transistors and high-k metal gate transistors.

Figure 4:
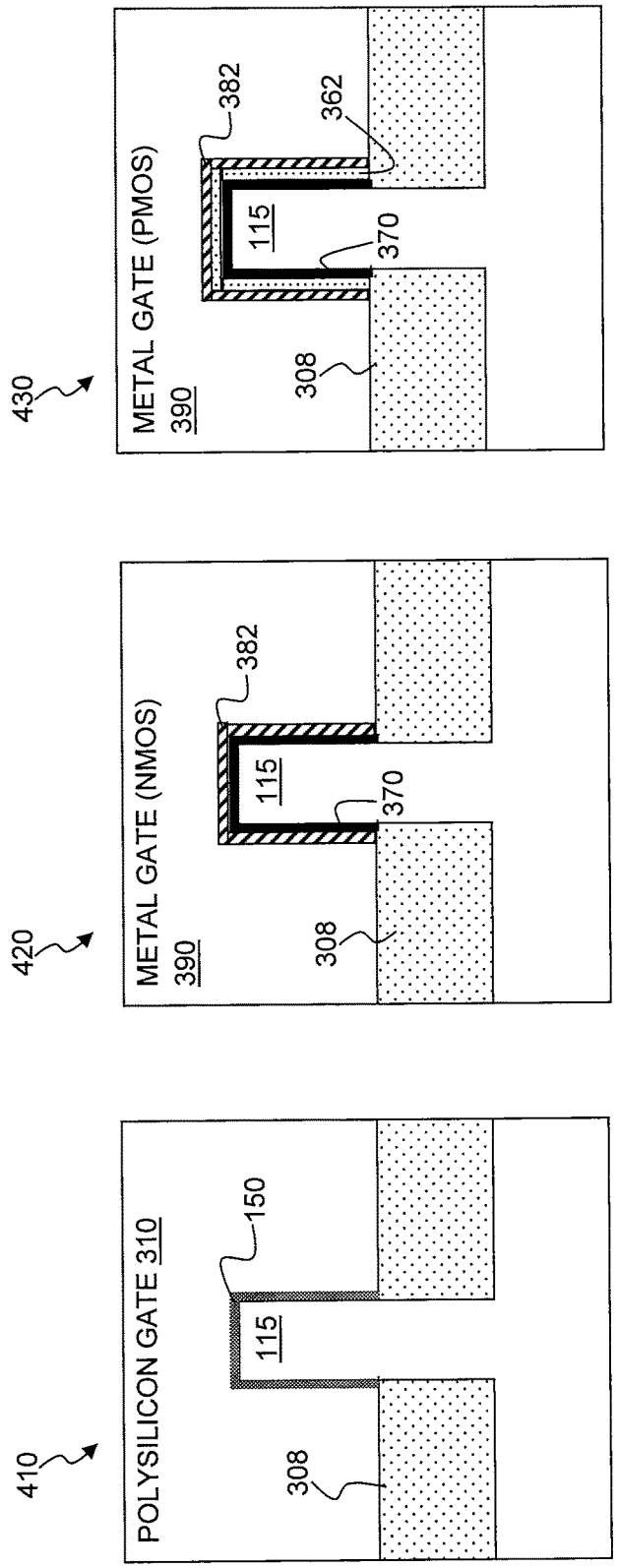
FIG. 4 shows respective fin respective cross sections of polysilicon gate and metal gate transistors in accordance with one embodiment of the present invention.

FIG. 4 shows respective fin cross sections (cross sections along the line XX' in FIG. 1) of the resulting polysilicon gate and metal gate transistors in accordance with one embodiment of the present invention. For the sake of brevity, elements that have been described above are not described in detail again. Each of the cross-sections shows fin 115 extending above ILD (or oxide) layer 308. In polysilicon gate transistor 410, polysilicon gate 310 wraps around fin 115 with gate oxide layer 150 disposed between polysilicon gate 310 and fin 115. It should be appreciated that polysilicon gate transistor 410 may be a PMOS or an NMOS transistor.

The cross-section of NMOS metal gate transistor 420 shows high-k dielectric layer 370 and NMOS work function metal layer 382 wrapping around fin 115. Metal 390 forms a metal gate electrode structure around the fin 115. As shown in the embodiment of FIG. 4, the cross-section of PMOS metal gate transistor 430 includes PMOS work function metal layer 362 that wraps around fin 115 between high-k dielectric layer 370 and NMOS work function metal layer 382. As mentioned above, during manufacturing of a device the NMOS work function metal layer 382 may be disposed after the formation of the PMOS work function metal layer. In one embodiment, NMOS work function metal layer 382 may not be etched off from metal gate PMOS transistor 430 (as shown in FIG. 4). In another embodiment, NMOS work function metal layer 382 may be etched from metal gate PMOS transistor 430 so that only high-k dielectric layer 370 and PMOS work function metal layer 362 remain between metal gate 390 and fin 115 (not shown in FIG. 4).

Figure 5:
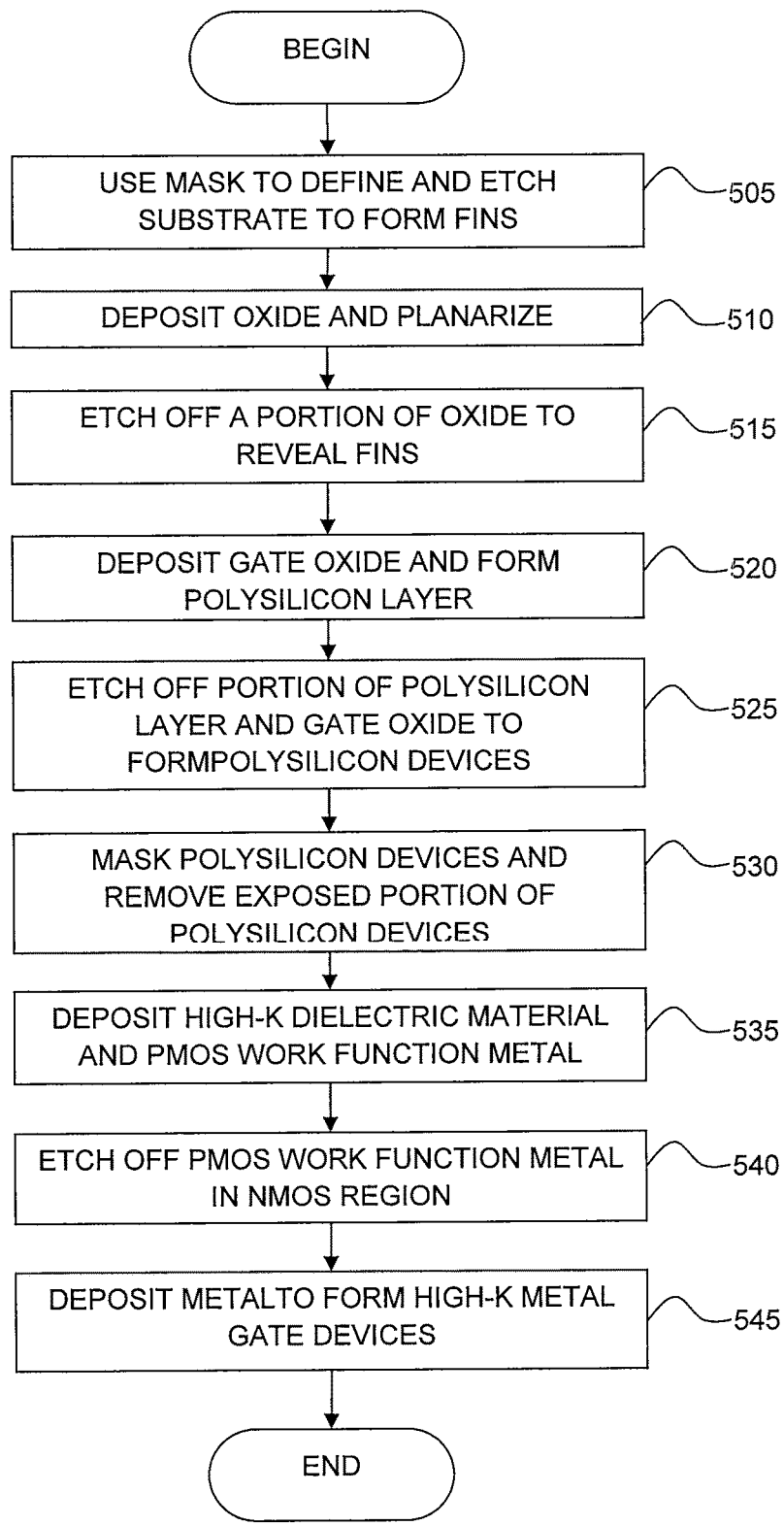
FIG. 5 is a flowchart of illustrative steps for fabricating an integrated circuit in accordance with the present invention.

FIG. 5 is a flowchart of illustrative steps for fabricating an integrated circuit in accordance with the present invention. At step 505, a mask is used to define and etch a substrate layer to form multiple fin structures such as that shown in the embodiment of FIG. 2B. An oxide material is deposited over the substrate layer at step 510. When the oxide material is first deposited, it may cover a top surface of the package layer and the fin structures that were formed at step 505. After that, a CMP process may be performed to planarize the oxide material such that it is substantially level with the surface of the fin structures. FIG. 2C shows oxide 110 deposited over substrate 108 and fins 115 while FIG. 2D shows the resulting substrate 108 and oxide 110 after planarization.

As can be seen in FIG. 2D, the trench regions formed by the multiple fin structures are filled with oxide 110. Accordingly, a portion of the oxide material needs to be etched off at step 515 to reveal the fin structures. At step 520, a gate oxide layer is deposited and a polysilicon layer is formed over the fin structures. The embodiment of FIG. 2E shows gate oxide layer 150 deposited over fin structures 115 prior to the formation of the polysilicon layer. At step 525, a portion of the polysilicon layer that has been formed over the gate oxide layer is etched off to form polysilicon gate electrode structures wrapping over the respective fin structures on the substrate layer. The resulting device thus formed may be known as polysilicon transistors.

At step 530, a portion of the polysilicon devices or transistors is masked. The remaining portion of the polysilicon devices that is exposed may be removed. FIG. 3B shows etch-resistant material 350 covering a portion of the polysilicon gate electrode structures 310 and trench regions 325 that are formed after the removal of the exposed polysilicon gate electrode structures. At step 535, a high-k dielectric material and a PMOS work function metal may be deposited into the resulting trench regions that are formed after the removal of the polysilicon gate electrode structures. As shown in FIG. 3C, the high-k dielectric layer and the PMOS work function metal may be conformal layers that line trench regions 325.

At step 540, the PMOS work function metal may be etched off from an NMOS region. In one embodiment, another mask or etch-resistant material may be used to cover a portion of the trench regions that have been lined with the PMOS work function metal layer, as shown in FIG. 3D. The PMOS work function metal layer in the remaining uncovered portion may thus be removed. Subsequently, an NMOS work function metal may be deposited the high-k dielectric layer after the PMOS work function metal layer has been etched off.

At step 545, high-k metal is deposited into the trench regions that have been lined with a layer of high-k dielectric material and PMOS/NMOS work function metal film. The high-k metal may form metal gate electrode structures that wraps over a portion of the fin structures. Another portion of the fin structures is wrapped with the earlier formed polysilicon gate electrode structures. In one embodiment, the resulting integrated circuit device may be a hybrid device that includes high-k metal gate and polysilicon transistors. The high-k metal gate and polysilicon transistors may have oxide layers with different thicknesses for better voltage control.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LOAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of a family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A method of fabricating an integrated circuit, comprising:
    forming a plurality of polysilicon gate structures over a plurality of fin-shaped channel structures;
    removing a portion of the plurality of polysilicon gate structures to form a trench and to expose a surface region of at least one fin-shaped channel structure in the plurality of fin-shaped channel structures;
    depositing a layer of high-k dielectric material within the trench on the exposed surface region;
    forming a first type of metal within the trench directly on the layer of high-k dielectric material;
    removing the first type of metal from the trench; and
    after removing the first type of metal from the trench, forming a second type of metal within the trench, wherein the first and second types of metal are different.

2. The method defined in claim 1 further comprising:
    patterning an etch resistant material over an additional portion of the plurality of polysilicon gate structures prior to removing the portion of the plurality of polysilicon gate structures.

3. The method defined in claim 1 further comprising:
    forming a pair of spacers alongside each polysilicon gate structure in the plurality of polysilicon gate structures, wherein removing the portion of the plurality of polysilicon gate structures exposes inner sides of the pair of spacers, and wherein the exposed surface region lies between the pair of spacers.

4. The method defined in claim 3, wherein the layer of high-k dielectric material lines the inner sides of the pair of spacers and the exposed surface region of the at least one fin-shaped channel structure.

5. The method defined in claim 1, wherein forming the first type of metal within the trench directly on the layer of high-k dielectric material comprises depositing a p-channel work function metal film over the high-k dielectric material prior to depositing the second type of metal.

6. The method defined in claim 1, wherein forming the first type of metal within the trench directly on the layer of high-k dielectric material comprises depositing an n-channel work function metal film over the high-k metal dielectric material prior to depositing the second type of metal.

7. A method of fabricating an integrated circuit, comprising:
    forming a plurality of fin channel structures on a semiconductor substrate;
    forming a plurality of polysilicon transistors by forming a plurality of polysilicon gate electrodes over a first portion of the plurality of fin channel structures; and
    forming a plurality of metal gate transistors by:
        forming a plurality of trenches over a second portion of the plurality of fin channel structures;
        forming a layer of high-k dielectric material within the trenches;
        forming metal gate electrodes on the layer of high-k dielectric material; and
        removing the metal gate electrodes from only some of the trenches.

8. The method defined in claim 7, wherein forming the plurality of polysilicon transistors comprises:
    forming a gate dielectric layer over the plurality of fin channel structures;
    depositing a polysilicon layer over the gate dielectric layer; and
    removing a portion of the gate dielectric layer and the polysilicon layer to form the plurality of polysilicon gate electrodes.

9. The method defined in claim 8, wherein each polysilicon transistor in the plurality of polysilicon transistors comprises source and drain regions, the method further comprising:
    forming a pair of spacers alongside each polysilicon gate electrode of the plurality of polysilicon gate electrodes to separate that polysilicon gate electrode from the associated source and drain regions.

10. The method defined in claim 9 further comprising:
    patterning an etch resistant material over a portion of the plurality of polysilicon transistors to expose an unshielded portion of the plurality of polysilicon transistors; and
    prior to forming the plurality of metal gate transistors, removing the unshielded portion of the plurality of polysilicon transistors to expose a surface region of the second portion of the plurality of fin channel structures and inner sides of the pair of spacers alongside each removed polysilicon transistor.

11. The method defined in claim 10 wherein the layer of high-k dielectric material is formed on the exposed surface region of the second portion of the plurality of fin channel structures, wherein the layer of high-k dielectric material lines the inner sides of the pair of spacers alongside each removed polysilicon transistor.

12. The method defined in claim 11, wherein forming the metal gate electrodes comprises depositing a p-channel functional metal over the layer of high-k dielectric material.

13. The method defined in claim 12 further comprising:
    etching a portion of the p-channel functional metal to expose a portion of the layer of high-k dielectric material; and
    depositing an n-channel functional metal of the exposed portion of the layer of high-k dielectric material.

14. An integrated circuit device, comprising:
    a substrate having a plurality of fin channel structures;
    a first plurality of transistors that is formed over a first portion of the plurality of fin channel structures and that includes only polysilicon gate conductors; and
    a second plurality of transistors that is formed over a second portion of the plurality of fin channel structures and that includes only metal gate conductors.

15. The integrated circuit device defined in claim 14, wherein the second plurality of transistors comprises high-k metal gate transistors formed by a metal gate disposed on a high-k dielectric layer.

16. The integrated circuit device defined in claim 15, wherein the integrated circuit device comprises first, second, and third regions, operating at first, second, and third voltage levels, respectively, wherein the second plurality of transistors is formed in the first and second regions, wherein the first plurality of transistors is formed in the third region, and wherein the third voltage level is greater than the first voltage level and lower than the second voltage level.

17. The integrated circuit device defined in claim 15, wherein the second plurality of transistors comprises a plurality of p-channel transistors and a plurality of n-channel transistors.

18. The integrated circuit device defined in claim 17, wherein each p-channel transistor of the plurality of p-channel transistors comprises a p-channel function metal layer disposed between the high-k dielectric layer and the metal gate, and wherein each n-channel transistor of the plurality of n-channel transistors comprises an n-channel function metal layer disposed between the high-k dielectric layer and the metal gate.

19. The integrated circuit device defined in claim 14 wherein a first portion of the second plurality of transistors comprises a first oxide thickness and a second portion of the second plurality of transistors comprises a second oxide thickness that is different than the first oxide thickness, and wherein the first plurality of transistors comprises a third oxide thickness that is different than the first and second oxide thicknesses.

20. An integrated circuit device, comprising:
a substrate having a plurality of fin channel structures;
a plurality of polysilicon transistors that is formed over a first portion of the plurality of fin channel structures and that has a first oxide thickness; and
a plurality of metal gate transistors that is formed over a second portion of the plurality of fin channel structures and that has a second oxide thickness that is different than the first oxide thickness.

21. The integrated circuit device of claim 14, wherein only the second plurality of transistors with the metal gate conductors includes a high-k dielectric layer.

22. The integrated circuit device of claim 14, wherein at least a first transistor in the first plurality of transistors has a given channel type, and wherein at least a second transistor in the second plurality of transistors has the given channel type.

* * * * *